US008882917B1

(12) United States Patent
Cheng et al.

(10) Patent No.: US 8,882,917 B1
(45) Date of Patent: Nov. 11, 2014

(54) SUBSTRATE PROCESSING INCLUDING CORRECTION FOR DEPOSITION LOCATION (75) Inventors: Jeremy Cheng, Cupertino, CA (US); Ho Yin Owen Fong, San Jose, CA (US); Dan Wang, Saratoga, CA (US); Zhendong Hong, San Jose, CA (US); Indranil De, Mountain View, CA (US)

(73) Assignee: Intermolecular, Inc., San Jose, CA (US)

( * ) Notice: Subject to any disclaimer, the term of this patent is extended or adjusted under 35 U.S.C. 154(b) by 1219 days.

(21) Appl. No.: 12/651,172

(22) Filed: Dec. 31, 2009

(51) Int. Cl.
*C23C 16/00* (2006.01)
*C23C 14/54* (2006.01)

(52) U.S. Cl.
CPC ..................................... *C23C 14/54* (2013.01)
USPC ............ 118/720; 118/715; 118/730; 700/108

(58) Field of Classification Search
CPC .......................... H01L 21/67242; C23C 14/54
USPC .......................................... 118/729–730, 669
See application file for complete search history.

(56) References Cited

U.S. PATENT DOCUMENTS

| 4,858,556 | A | * | 8/1989 | Siebert ........................... 118/664 |
| 5,985,356 | A | | 11/1999 | Schultz et al. |
| 6,004,617 | A | | 12/1999 | Schultz et al. |
| 6,045,671 | A | * | 4/2000 | Wu et al. .......................... 506/40 |
| 6,270,861 | B1 | * | 8/2001 | Mashburn ...................... 427/561 |
| 6,290,826 | B1 | * | 9/2001 | Obinata et al. ............ 204/298.28 |
| 6,419,803 | B1 | * | 7/2002 | Baldwin et al. ........... 204/192.13 |
| 6,485,285 | B1 | * | 11/2002 | Shiotani .......................... 425/139 |
| 6,491,759 | B1 | * | 12/2002 | Christen et al. ............... 118/722 |
| 6,547,939 | B2 | * | 4/2003 | Hsueh et al. ............. 204/298.03 |
| 6,579,420 | B2 | * | 6/2003 | Wan et al. ................. 204/192.11 |
| 6,830,663 | B2 | | 12/2004 | Wang et al. |
| 6,911,129 | B1 | * | 6/2005 | Li ............................. 204/298.11 |
| 6,949,267 | B2 | | 9/2005 | Moini et al. |
| 7,033,461 | B2 | * | 4/2006 | Tani et al. ................. 204/192.13 |
| 7,179,334 | B2 | * | 2/2007 | Sakamoto et al. ............ 118/668 |
| 7,229,566 | B2 | * | 6/2007 | Matsumoto et al. ............ 216/60 |
| 7,247,346 | B1 | | 7/2007 | Sager et al. |
| 8,440,475 | B2 | * | 5/2013 | Habets et al. .................... 438/16 |
| 2001/0053043 | A1 | * | 12/2001 | Kanazawa et al. ............ 360/110 |
| 2002/0183879 | A1 | * | 12/2002 | Schedel et al. ................ 700/108 |
| 2006/0109297 | A1 | * | 5/2006 | Su et al. .......................... 347/20 |

(Continued)

OTHER PUBLICATIONS

Wang et al., Combinatorial Synthesis of solid state electronic materials for renewable energy applications, Applied Surface Science, 2002, pp. 271-276, vol. 189, Elsevier Science B.V.

(Continued)

*Primary Examiner* — Gordon R Baldwin
*Assistant Examiner* — Charlee Bennett (57) ABSTRACT

Substrate processing including correction for deposition location is described, including a combinatorial processing chamber that incorporates the correction. The combinatorial processing chamber can be used to process multiple regions of a substrate using different processing parameters on different regions. For example, one region can have one material deposited on it and another region can have a different material deposited on it, although other combinations and variations are possible. The combinatorial processing chamber uses a rotating and revolving substrate pedestal to be able to deposit on all locations or positions on a substrate. The combinatorial processing chamber uses a correction factor that accounts for variations in alignment and/or configuration of the processing chamber so that the actual location of deposition of a region is approximately the same as a desired location of deposition.

10 Claims, 8 Drawing Sheets

(56) References Cited

U.S. PATENT DOCUMENTS

| | | |
|---|---|---|
| 2007/0082508 A1 | 4/2007 | Chiang et al. |
| 2007/0202614 A1 | 8/2007 | Chiang et al. |
| 2008/0020589 A1 | 1/2008 | Chiang et al. |
| 2008/0182344 A1* | 7/2008 | Mueller et al. ............... 438/5 |
| 2009/0061108 A1 | 3/2009 | Endo et al. |
| 2009/0136663 A1* | 5/2009 | Sano et al. ............ 427/248.1 |
| 2011/0209663 A1* | 9/2011 | Endo et al. ............... 118/719 |
| 2012/0258255 A1* | 10/2012 | Yang et al. ............... 427/523 |
| 2013/0130509 A1* | 5/2013 | Child et al. ............... 438/758 |

OTHER PUBLICATIONS

Ludwig et al., MEMS tools for combinatorial materials processing and high-throughput characterization, Meas. Sci. Technol., 2005, pp. 111-118, vol. 16, Institute of Physics Publishing.

Cooper et al., Plasma sputtering system for deposition of thin film combinatorial libraries, Review of Scientific Instruments, 2005, pp. 062221-1-062221-7, vol. 76, American Institute of Physics.

Maier et al., Combinatorial and High-Throughput Materials Science, Angewandte Chemie, 2007, pp. 6016-6067, vol. 46, Wiley-VCH Verlag GmbH.

Guerin et al., Physical Vapor Deposition Method for the High-Throughput Synthesis of Solid-State Material Libraries, 2006, pp. 66-73, vol. 8, American Chemical Society.

Xiang, Combinatorial Materials Synthesis and Screening: An Integrated Materials Chip Approach to Discovery and Optimization of Functional Materials, Annu. Rev. Mater. Sci., 1999, pp. 149-171, vol. 29, Annual Reviews.

* cited by examiner

```
                    ┌─────────────────────────────────────────────────────────────────┐
                    │ Process multiple regions of substrate using at least one a of a rotation of a substrate    │──── 1202
                    │ pedestal holding the substrate about a first axis of the substrate pedestal and a revolution of │
                    │ the processing aperture about a second axis approximately parallel to the first axis of the │
                    │ rotation of the substrate pedestal to position the processing aperture over the multiple    │
                    │                               regions                                                        │
                    └─────────────────────────────────────────────────────────────────┘
```

1200

- Process multiple regions of substrate using at least one a of a rotation of a substrate pedestal holding the substrate about a first axis of the substrate pedestal and a revolution of the processing aperture about a second axis approximately parallel to the first axis of the rotation of the substrate pedestal to position the processing aperture over the multiple regions — 1202
- Measure actual positions of multiple regions — 1204
- Compare actual positions of multiple regions to desired positions of multiple regions — 1206
- Calculate correction vectors based on the comparison — 1208
- Determine the correction factor using the correction vectors — 1210

SUBSTRATE PROCESSING INCLUDING CORRECTION FOR DEPOSITION LOCATION

GOVERNMENT RIGHTS IN THIS INVENTION

This invention was made with U.S. government support under contract numbers and H94003-08-C-0806 and H94003-08-C-0805. The U.S. government has certain rights in this invention.

CROSS-REFERENCE TO RELATED APPLICATIONS

This application is related to U.S. patent application Ser. No. 12/027,980, filed Feb. 7, 2008, and entitled "Combinatorial Process System," U.S. patent application Ser. No. 12/028,643, filed Feb. 8, 2008, and entitled "Combinatorial Process System," and U.S. patent application Ser. No. 12/205,544, filed Sep. 5, 2008, and entitled "Combinatorial Process System," all of which are incorporated herein by reference.

FIELD OF THE INVENTION

The present invention relates generally to semiconductor processing tools. More specifically, a processing chamber including a correction for a deposition location is described.

BACKGROUND OF THE INVENTION

Deposition processes are commonly used in semiconductor manufacturing to deposit a layer of material onto a substrate. Processing is also used to remove layers, defining features (e.g., etch), preparing layers (e.g., cleans), doping or other processes that do not require the formation of a layer on the substrate. Processes and process shall be used throughout the application to refer to these and other possible known processes used for semiconductor manufacturing and any references to a specific process should be read in the context of these other possible processes. In addition, similar processing techniques apply to the manufacture of integrated circuits (IC) semiconductor devices, flat panel displays, optoelectronics devices, data storage devices, magneto electronic devices, magneto optic devices, packaged devices, and the like. As feature sizes continue to shrink, improvements, whether in materials, unit processes, or process sequences, are continually being sought for the deposition processes. However, semiconductor companies have traditionally conducted research and development (R&D) on full wafer processing through the use of split lots, as the deposition systems are designed to support this processing scheme. This approach has resulted in ever escalating R&D costs and the inability to conduct extensive experimentation in a timely and cost effective manner. Techniques and systems for depositing increasing processing throughput for semiconductor R&D have been previously described. However, some of these systems are amenable to improved accuracy during deposition to increase throughput. Thus, techniques for improving the accuracy of the testing of multiple different process variations on a single substrate is provided to more efficiently evaluate the viability of different materials, unit processes, or process sequences.

BRIEF DESCRIPTION OF THE DRAWINGS

Various embodiments of the invention are disclosed in the following detailed description and the accompanying drawings.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

According to various embodiments, a combinatorial processing chamber is described herein. The combinatorial processing chamber can be used to process multiple regions of a substrate using different processing parameters on different regions. For example, one region can have one material deposited on it and another region can have a different material deposited on it, although other combinations and variations are possible. The combinatorial processing chamber uses a rotating and revolving substrate pedestal to be able to position a processing aperture relative to a substrate and to be able to deposit on all locations or positions on a substrate. The combinatorial processing chamber uses a correction factor that accounts for variations in alignment and/or configuration of the processing chamber so that the actual location of deposition of a region is approximately the same as a desired location of deposition.

I. Combinatorial Processing and a Combinatorial Processing System

A. Combinatorial Processing

"Combinatorial Processing" generally refers to techniques of differentially processing multiple regions of a substrate. Combinatorial processing can be used to produce and evaluate different materials, chemicals, processes, and techniques related to semiconductor fabrication as well as build structures or determine how the above coat, fill or interact with existing structures. Combinatorial processing varies materials, unit processes and/or process sequences across multiple regions on a substrate.

As an example, a substrate (such as a wafer), can be processed in a processing chamber that uses a plasma based process such as physical vapor deposition (PVD) or plasma etching. The substrate can be processed so that multiple regions of the substrate are processed using different process parameters. For example, one region can have a first material deposited thereon, while another region has a different material deposited thereon to examine the different properties of the materials. As another example, the same material can be deposited on two different regions using different unit processes or process sequences to examine the effects of the differences in unit process or process sequence. By depositing multiple regions having different properties, many different process parameters can be tested or examined in an accelerated manner.

B. Combinatorial Processing Chamber

Figure 1:
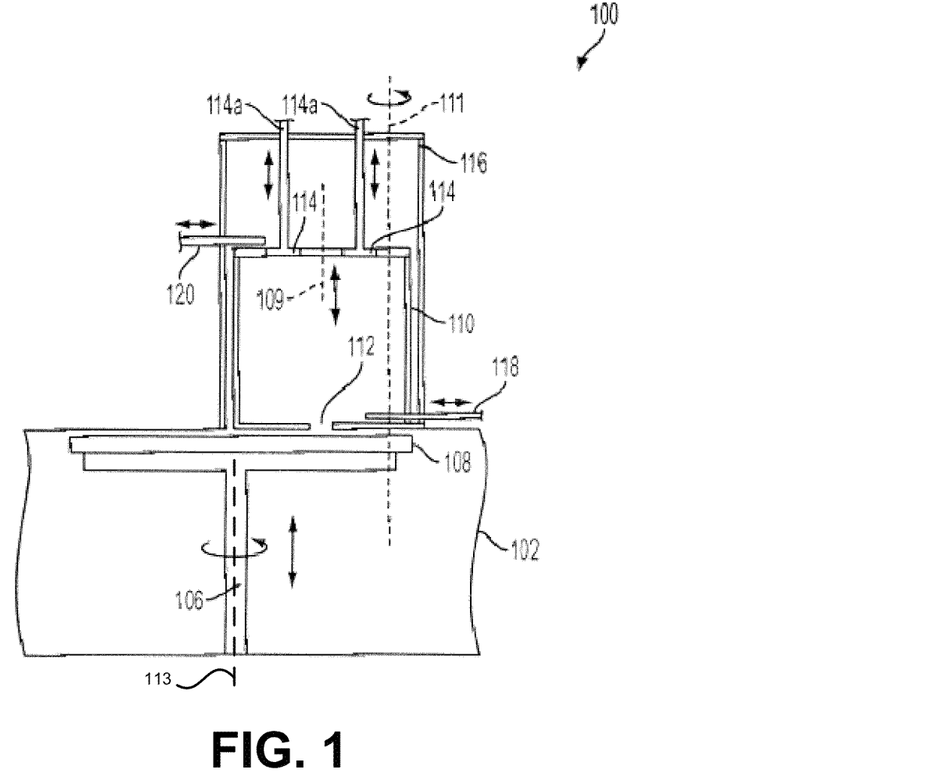
FIG. 1 is a simplified schematic diagram illustrating a processing chamber configured to combinatorially process a substrate disposed therein in accordance with one embodiment of the invention.

FIG. 1 is a simplified schematic diagram illustrating a processing chamber configured to combinatorially process a substrate disposed therein in accordance with one embodiment of the invention. Processing chamber 100 includes a bottom chamber portion 102 disposed under top chamber portion 116. Within bottom portion 102 substrate pedestal 106 is configured to hold a substrate 108 disposed thereon. Substrate pedestal 106 is capable of rotating around a central axis 113 of the substrate pedestal 106. In one embodiment, substrate pedestal 106 rotates approximately 185 degrees to provide full access to the surface of a substrate 108. In another embodiment substrate pedestal 106 rotates 360 degrees. In addition, substrate pedestal 106 may move in a vertical direction or in a planar direction. It should be appreciated that the rotation and movement in the vertical direction or planar direction may be achieved through known drive mechanisms which include magnetic drives, linear drives, worm screws, lead screws, a differentially pumped rotary feed through drive, etc. In some embodiments, the center of the substrate 108 may not align with the center of the substrate pedestal 106 (i.e. the axis 113). The correction factor can be used to account for this misalignment, as well as other misalignments.

Substrate 108 may be a conventional round 200 millimeter, 300 millimeter or any other larger or smaller substrate/wafer size. In other embodiments, substrate 108 may be a square, rectangular, or other shaped substrate. One skilled in the art will appreciate that substrate 108 may be a blanket substrate, a coupon (e.g., partial wafer), or even a patterned substrate having predefined regions. In another embodiment, substrate 108 may have regions defined through the processing described herein. The term region is used herein to refer to a localized area on a substrate which is, was, or is intended to be used for processing or formation of a selected material. The region can include one region and/or a series of regular or periodic regions pre-formed on the substrate. The region may have any convenient shape, e.g., circular, rectangular, elliptical, wedge-shaped, etc. In the semiconductor field a region may be, for example, a test structure, single die, multiple die, portion of a die, other defined portions of a substrate, or undefined area of substrate, e.g. a blanket substrate which is defined through the processing. Substrates can be any type of substrate that can be processed by processing chamber 100, such as semiconductor substrates for semiconductor devices, substrates for creating solar, photovoltaic, or optoelectronic devices, etc.

Top chamber portion 116 of chamber 100 in FIG. 1 includes process kit shield 110, which defines a confinement region over a radial portion of substrate 108. Process kit shield 110 is in essence a sleeve having a base (optionally integral with the shield) and an optional top within chamber 100 that may be used to confine a plasma generated therein. The generated plasma will dislodge particles from a target to process (e.g., be deposited) on an exposed surface of substrate 108 to combinatorially process regions of the substrate in one embodiment. In other embodiments, other types of processing, such as plasma etching, can be performed using the processing chamber 100. Process kit shield 110 is capable of being moved in and out of chamber 100, i.e., the process kit shield is a replaceable insert. Process kit shield 110 includes an optional top portion, sidewalls and a base. In one embodiment, process kit shield 110 is configured in a cylindrical shape, however, the process kit shield may be any suitable shape and is not limited to a cylindrical shape.

The process kit shield 110 is removable and replaceable. When the process kit shield 110 is removed and/or replaced, the calibration of the processing chamber 100 can be affected. If coordinates are selected to deposit at a desired location (region) on the substrate 108, the processing aperture 112 may deposit at an actual location offset from the desired location because the components of the processing chamber 100 may have a different alignment than they did previously.

The base of process kit shield 110 includes a processing aperture 112 that is configured to deposit at least one material on the substrate. The processing aperture 112 can emit materials to be deposited (e.g. sputtered) on the region of the substrate 108 over which the processing aperture 112 is positioned. Within top portion 116 is cover plate 118 which is moveably disposed over the base of process kit shield 110. Cover plate 118 (or aperture shutter) may move across a bottom surface of the base of process kit shield 110 in order to cover or expose processing aperture 112 in one embodiment. In another embodiment, cover plate 118 is controlled through an arm extension which moves the cover plate to expose or cover processing aperture 112 as will be described in more detail below. It should be noted that although a single processing aperture 112 is illustrated, multiple apertures may be included. Each processing aperture 112 may be associated with a dedicated cover plate or a cover plate can be configured to cover more than one aperture simultaneously or separately. Alternatively, processing aperture 112 may be a larger opening and plate 118 may extend with that opening to either completely cover it or place one or more fixed apertures within that opening for processing the defined regions. In some embodiments, the processing aperture 112 may be rotatable to deposit non-circular patterns to match with the shape of processed substrates. One or more quartz crystal microbalance sensors can be mounted on the process kit to calibrate the PVD film thickness and quality.

The optional top plate of process kit shield 110 of FIG. 1 may function as a datum shield as will be described further below. Process heads 114 (also referred to as deposition guns) are disposed within slots defined within the datum shield in accordance with one embodiment of the invention. Where a datum shield is utilized in the chamber, a datum shield slide cover plate 120 may be included. Datum shield slide cover plate 120 (or gun shutter) functions to seal off a deposition gun when the deposition gun may not be used for the processing. For example, two deposition guns 114 are illustrated in FIG. 1. Process heads 114 are moveable in a vertical direction so that one or both of the guns may be lifted from the slots of the datum shield. While two process heads are illustrated, any number of process heads may be included, e.g., three or four process heads may be included. Where more than one process head is included, the plurality of process heads may be referred to as a cluster of process heads. Slide cover plate 120 can be transitioned to isolate the lifted process heads 114 from the processing area defined within process kit shield 110. In this manner, the process heads are isolated from certain processes when desired. It should be noted that while one slide cover plate 120 is illustrated, multiple slide cover plates may be included so that each slot or opening of the datum shield is associated with a cover plate. Alternatively, slide cover plate 120 may be integrated with the top of the shield unit 110 to cover the opening as the process head is lifted or individual covers can be used for each target.

Top section 116 of chamber 100 of FIG. 1 includes sidewalls and a top plate which house process kit shield 110. Arm extensions 114a, which are fixed to process heads 114 extend through the region defined within top portion 116. Arm extensions 114a may be attached to a suitable drive, e.g., lead screw, worm gear, etc., configured to vertically move process heads 114 toward a top plate of top portion 116. Arm extensions 114a may be pivotably affixed to process heads 114 to enable the process heads to tilt relative to a vertical axis. In one embodiment, process heads 114 tilt toward processing aperture 112. In another embodiment, arm extensions 114a are attached to a bellows that allows for the vertical movement and tilting of process heads 114. Where a datum shield is utilized, the openings are configured to accommodate the tilting of the process heads. In one embodiment, the process heads are tilted by ten degrees or less relative to the vertical axis. It should be appreciated that the tilting of the process head enables tuning so that the gun may be tilted toward an aperture in the base plate to further enhance uniformity of a layer of material deposited through the aperture.

As illustrated in FIG. 1, process kit shield 110 is moveable in a vertical direction. The substrate pedestal 106 is configured to revolve around an axis 111 and rotate about an axis 113. The rotation and revolution of the substrate pedestal 106 allows for the positioning of the processing aperture 112 over any location of the substrate 108. The revolution of the substrate pedestal 106, in particular, revolves the processing aperture 112 relative to the substrate 108 (and relative to the substrate pedestal 106). As used herein, revolution and revolving refer to positioning the processing aperture 112 by rotating it about an axis 111 relative to the substrate 108 and substrate pedestal 106. For example, in other embodiments, the process kit shield 110 is configured and able to revolve around the axis 111. It should be appreciated that the axis 111 around which the substrate pedestal 106 revolves is offset from both the axis 113 around which substrate pedestal 106 rotates and an axis 109 of a cluster of process heads in one embodiment. In one embodiment, the axis 111 is approximately parallel to the axis 113, for example, the axis 111 may be parallel to within 5° of the axis 113. In this manner, a plurality of regions on substrate 108 may be exposed for combinatorial processing as described further with reference to FIG. 3. While process heads 114 are described as clustered on the same axis as processing aperture 112, additional heads may be offset from the cluster of heads for doping, implantation or deposition of small amounts of a material, e.g., 1-10% without limitation. An alternative embodiment to provide access to regions on the entire substrate may include linear movement of upper chamber 116 as opposed to movement in an arc as shown in the figures.

Figure 2:
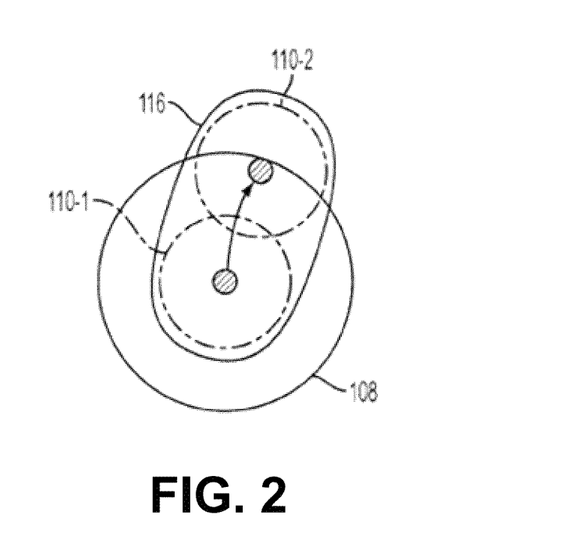
FIG. 2 is a simplified schematic diagram of exemplary different positions of the process kit shield relative to a substrate in accordance with one embodiment of the invention.
Figure 5:
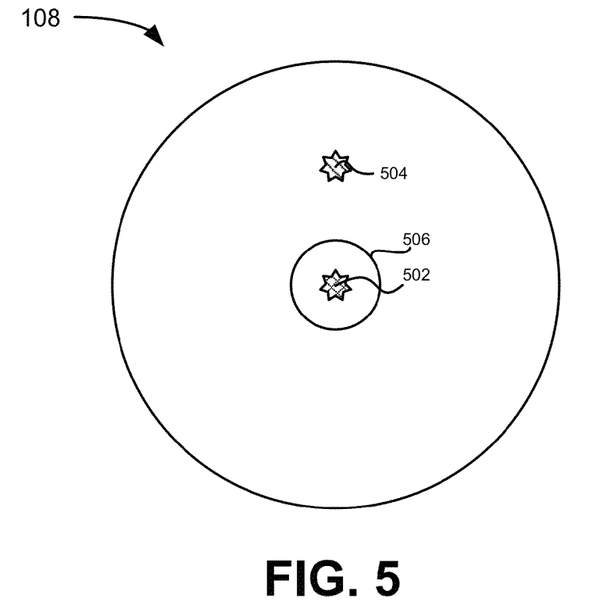
FIG. 5 is an overhead view of a substrate showing a center of the substrate, a revolution center of the process kit shield and the processing aperture, and a position of the processing aperture over the substrate.
Figure 6:
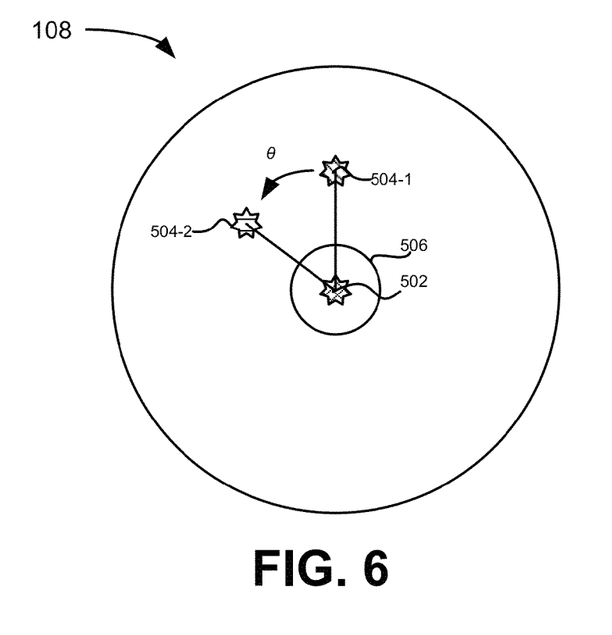
FIG. 6 is an overhead view of the substrate after the substrate has been rotated, showing the center of the substrate, the revolution center, and the position of the processing aperture.
Figure 7:
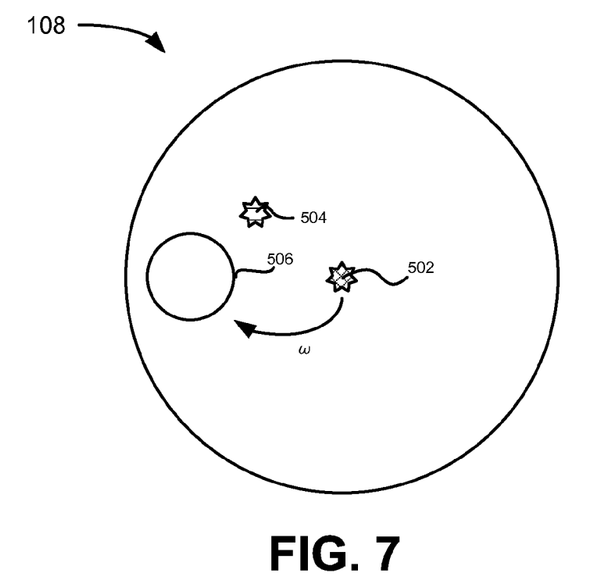
FIG. 7 is an overhead view of the substrate after the substrate pedestal has revolved.

FIG. 2 is a simplified schematic diagram of exemplary different positions of the process kit shield 110 in accordance with one embodiment of the invention. Process kit shield 110 and the processing aperture 112 may move relative to the substrate 108. As discussed herein, substrate pedestal 106 may revolve about the axis 111 to move the process kit shield 110 between positions 110-1 and 110-2 relative to the substrate pedestal 106. It should be appreciated that top section 116 may be any suitable shape to accommodate this movement, including circular, kidney shaped, oval, rectangular, etc. In addition, the relative size of the process kit shield 110 may be based on the number of heads and other design factors. Thus, the process kit shield 110 may be smaller, larger, or the same size as substrate 108 depending on the number and configuration of process heads as well as other design factors. FIGS. 5-7 illustrate the positioning of the processing aperture 112 above the substrate 108 during the rotation of the substrate 108 and the revolution of the processing aperture 112.

In some embodiments described herein, a controller controlling the rotation of the substrate pedestal 106 and the revolution of the process kit shield 110 can apply a correction factor to account for offsets due to misalignments in the processing chamber 100. The correction factor can be applied so that the actual location of deposition on the substrate 108 is approximately the same as the desired location of deposition on the substrate.

Figure 3:
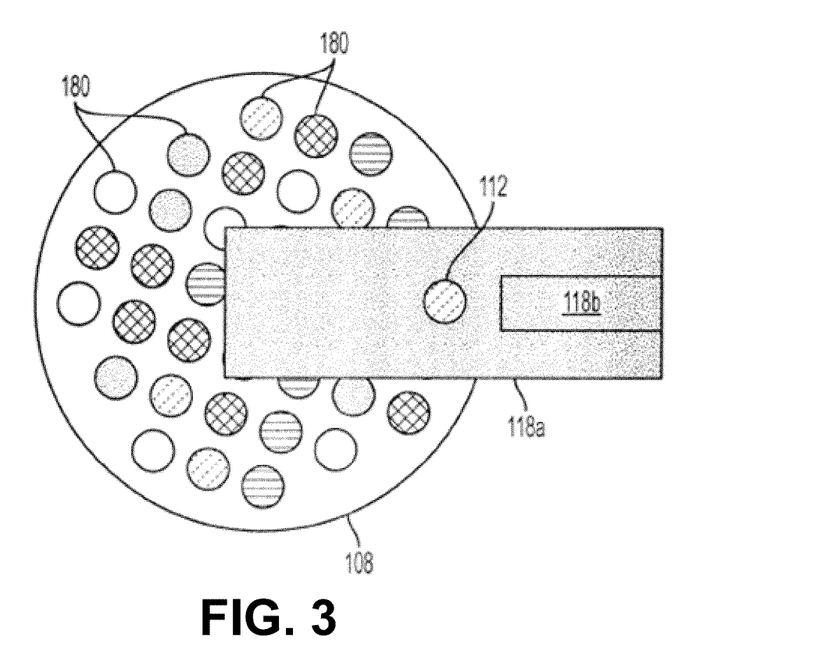
FIG. 3 is a simplified schematic diagram illustrating a pattern disposed over a substrate in accordance with one embodiment of the invention.

FIG. 3 is a simplified schematic diagram illustrating a pattern disposed over a substrate in accordance with one embodiment of the invention. In FIG. 3, an array of regions 180 (i.e. multiple regions 180) are processed on substrate 108. In order to provide access to those regions for processing, between processing steps and per the experimental design processing aperture 112 is moved across a surface of substrate 108 within the slot in the base plate and the substrate 108 is rotated and the processing aperture 112 is revolved relative to the substrate 108 as necessary so that multiple regions can be processed combinatorially on one substrate. For example, as used herein, the substrate pedestal 106 (and the substrate 108) are rotated through an angle θ, and the substrate pedestal 106 is revolved through an angle co so that the processing aperture 112 revolves relative to a center of the substrate 108.

Figure 4:
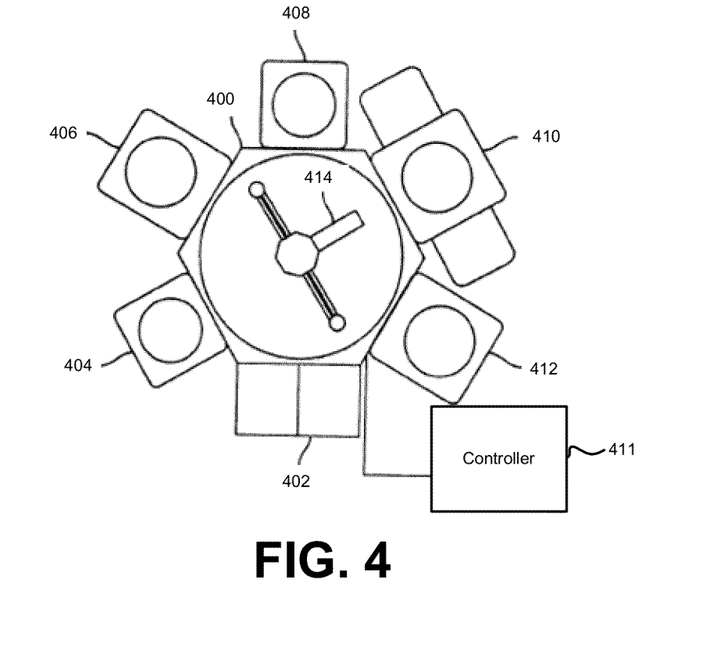
FIG. 4 a simplified schematic diagram illustrating an integrated high productivity combinatorial (HPC) system in accordance with one embodiment of the invention.

FIG. 4 a simplified schematic diagram illustrating an integrated high productivity combinatorial (HPC) system in accordance with one embodiment of the invention. HPC system includes a frame 400 supporting a plurality of processing modules. It should be appreciated that frame 400 may be a unitary frame in accordance with one embodiment. In one embodiment, the environment within frame 400 is controlled. Load lock/factory interface 402 provides access into the plurality of modules of the HPC system. Robot 414 provides for the movement of substrates (and masks) between the modules and for the movement into and out of the load lock 402. Modules 404-412 may be any set of modules and preferably include one or more combinatorial modules. For example, module 404 may be an orientation/degassing module, module 406 may be a clean module, either plasma or non-plasma based, module 408 and 410 may be combinatorial modules (e.g. the processing chamber 100) in according with this invention or of other design, and module 412 may provide conventional clean or out-gassing as necessary for the experiment design.

Any type of chamber or combination of chambers may be implemented and the description herein is merely illustrative of one possible combination and not meant to limit the potential chamber or processes that can be supported to combine combinatorial processing or combinatorial plus conventional processing of a substrate/wafer. In one embodiment, a centralized controller 411, may control the processes of the HPC system. In some embodiments, the system includes multiple controllers. For example, each module 404-412 may have its own controller, and the robot 414 and interface 402 may have their own controllers. As used herein, the controller 411 can represent any combination of controllers, such as a single controller that operates the entire system, multiple controllers that operate each module individually, multiple controllers that each operate multiple modules, etc. Further details of one possible HPC system are described in U.S. application Ser. Nos. 11/672,478 and 11/672,473. With HPC system, a plurality of methods may be employed to deposit material upon a substrate employing combinatoric processes.

II. Determination of Correction Factor

A. Substrate Layout and Positioning of Processing Aperture Relative to the Substrate FIG. 5 is an overhead view of a substrate 108 showing a center 502 of the substrate 108, a revolution center 504 (of the substrate pedestal 106 and the processing aperture 112 relative to the substrate pedestal 106, along the axis 111), and a position 506 of the processing aperture 112. The position 506 of the processing aperture 112 represents the position of the processing aperture 112 above the substrate 108, for example as is shown in FIG. 1. The circle designating the position 506 of the processing aperture 112 denotes an approximate location of a region (e.g. one of the regions 180) on the substrate 108 that is processed by the processing chamber 100. The layout of the substrate 108 as shown in FIG. 5, as well as in FIGS. 6 and 7, is an ideal representation of the positions of the centers 502 and 504 and position 506 of the processing aperture 112. In other words, FIG. 5 illustrates the desired positions of the revolution center 504 and the desired center position 506 of the processing aperture 112 when the system is in a "home" position (i.e. (0, 0)) or when the processing aperture 112 is centered over the center 502 of the substrate 108. In reality, the centers 502 and 504 and position 506 often do not align into their desired positions because of the alignment of the individual components of the processing chamber 100, including the position of the substrate pedestal 106, the process kit shield 110, and the position of the substrate 108 relative to the substrate pedestal 106, varies from the ideal by some amount. In embodiments described herein, the controller 411 is configured to use a correction factor that accounts for the difference between the actual positions of the centers and the desired positions of the centers, as well as the difference between the location of the center of the substrate pedestal 106 (i.e. the axis 113) and the center 502 of the substrate 108. The description accompanying FIGS. 8-12 describes how the correction factor is calculated. The description accompanying FIG. 13 describes how deposition using the correction factor is performed. As used herein, the "desired" location of deposition on the substrate 108 refers to a user's or system's (e.g. the controller 411) input, such as coordinates, describing where to deposit a region on the substrate. The "actual" location of deposition on the substrate 108 refers to the actual location that the deposition occurs at in response to the input, and may differ from the desired location because of misalignments in the processing chamber or other reasons. However, using the correction factor, the actual location can be approximately the same as the desired position. For example, a user or a system may interact with the processing chamber 100 by indicating the coordinates on the substrate that a region should be deposited. The coordinates can be, for example, Cartesian coordinates expressed in an (x, y) format. The controller 411 converts the coordinates to $\theta$ and $\omega$ angles (see FIGS. 6 and 7) that can be used to rotate and revolve the substrate pedestal 106. The controller 411 can also include the correction factor in the conversion to $\kappa$ and $\omega$ angles to ensure that the actual and desired locations are approximately the same.

FIG. 6 is an overhead view of the substrate 108 after the substrate 108 has been rotated. As is described above, the substrate 108 can be rotated by the substrate pedestal 106 about the axis 113 to change the position of the revolution center 504 (e.g. from the position 504-1 to the position 504-2) so that other areas of the substrate 108 can be accessible to the processing aperture 112 by revolving the substrate 108 using the substrate pedestal 106. As used herein, when the substrate 108 rotates by rotation of the substrate pedestal 106, the rotation is through an angle $\theta$. As shown in FIG. 6, the processing aperture 112 is still located at position 506 over the center 502 of the substrate 108 because the substrate pedestal 106 has not revolved to move the processing aperture 112 relative to the substrate 108. The processing aperture 112 shown here has a circular shape, however it is understood that the processing aperture 112 can have any shape, for example rectangular, triangular, etc. If the processing aperture 112 is not circular, then upon rotation of the substrate pedestal 106, the processing aperture 112 may reorient relative to the substrate 108.

FIG. 7 is an overhead view of the substrate 108 after the substrate pedestal 106 has revolved. The substrate pedestal 106 revolves around the axis 111 (i.e. the revolution center 504) and through an angle $\omega$ to revolve the processing aperture 112 relative to the substrate 108. The processing aperture 112 (shown as the position 506) is now positioned over the desired location of the substrate 108 for deposition. The processing aperture 112 is positioned over the desired location because the positions as shown in FIG. 7 represent an ideal representation, where there is no misalignment and no need for correction. For example, the aperture 112 can be used to deposit at least one material on a region 180 of the substrate 108 corresponding to the position 506 of the processing aperture 112. The region can be one of multiple regions 180 that are deposited in a combinatorial manner.

Using the rotation of the substrate 108 through the angle $\theta$ and revolution of the substrate pedestal 106 through the angle $\omega$, any location on the substrate 108 can be processed. Generally, a user of the processing chamber 100 can instruct the controller 411 to select a location on the substrate 108 to deposit a material in a region or to perform any other processing operation (e.g. etching). The location can be specified by giving coordinates, for example Cartesian coordinates (e.g. in an (x, y) format) or polar coordinates (e.g. specifying a distance and an angle in a (r, $\phi$)) format, or specifying the coordinates in the rotation of the substrate 108 and the revolution of the processing aperture 112 ($\theta$, $\omega$) relative to the substrate pedestal 106. The coordinates can have a correction factor applied to them such that the intended or desired location of the substrate 108 is actually processed. The description of FIGS. 8-13 can be used to determine or calculate and apply the correction factor.

B. Offsets and Correction Vectors

Figure 8:
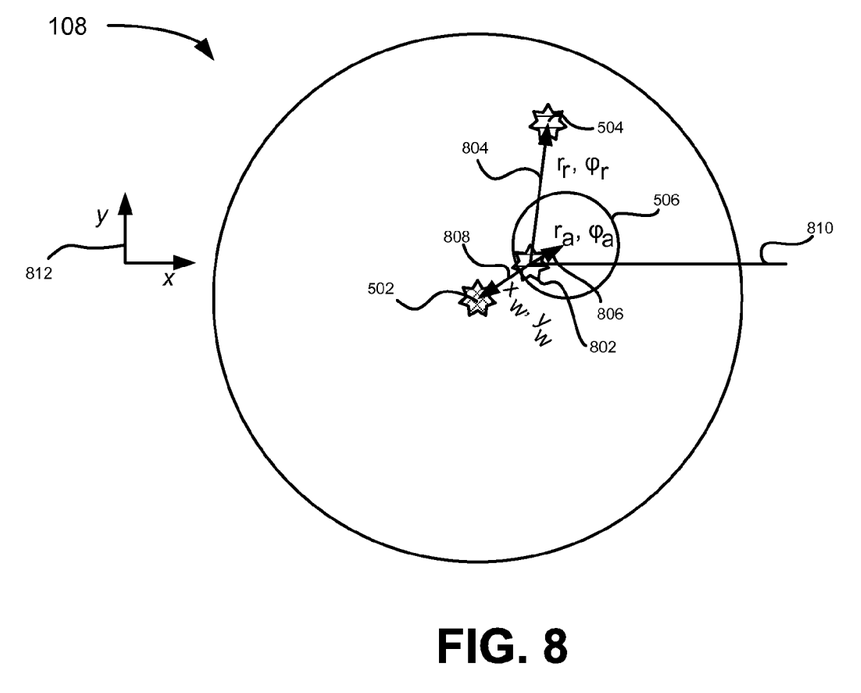
FIG. 8 illustrates correction vectors on a substrate that can be used to determine a correction factor according to various embodiments described herein.

FIG. 8 illustrates the correction vectors on a substrate 108 that can be used to determine a correction factor according to various embodiments described herein. The correction factor described herein accounts for offsets between the actual positions and the desired positions of certain features. As used herein, the correction factor accounts for three offsets: a first offset between the rotation center of the substrate pedestal and the center of the substrate, a second offset between an actual position of the aperture and a desired position of the aperture, and a third offset between an actual position of the revolution center and a desired position of the revolution center.

Correction vectors are used to calculate the correction factor, and are defined as vectors originating at the origin of the frame of reference. The correction vectors measure the actual position of the features relative to the frame of reference, and using the calculations described herein can be used to calculate a correction factor that accounts for the three offsets described above. As described herein, the frame of reference is defined by the rotation center 802 of the substrate pedestal 106 along the axis 113, which is (0, 0). The line 810 defines 0° in polar coordinates, with the angle φ increasing in the counterclockwise direction. Additionally, a Cartesian coordinate system can be defined by the axes 812, with the origin (0, 0) at the rotation center 802.

There are three correction vectors 804, 806, and 808 that can be used to determine the correction factor:

- Correction vector 804, which defines the location of the revolution center 504, which is given by $(r_r, \phi_r)$ in polar coordinates,
- Correction vector 806, which defines the position of the center 810 of the position 506 of the processing aperture 112, which is given by $(r_a, \phi_a)$ in polar coordinates, and
- Correction vector 808, which defines the offset between the center 502 of the substrate 108 and the rotation center 802, which is given by $(x_w, y_w)$ in Cartesian coordinates.

Figure 9:
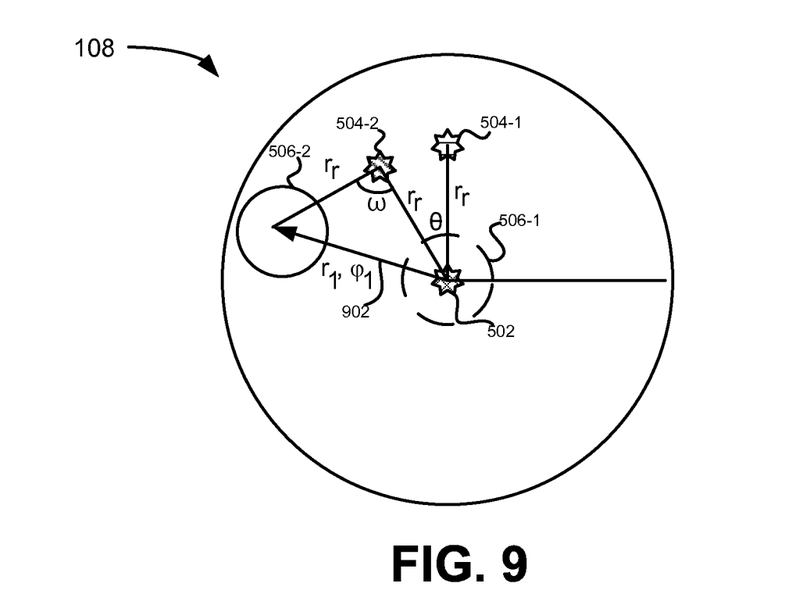
FIG. 9 illustrates a substrate processing using the processing chamber after a rotation and a revolution.

FIG. 9 illustrates a substrate 108 processing using the processing chamber 100 after a rotation and a revolution. The substrate 108 shown in FIG. 9 illustrates the ideal situation: where the input of desired coordinates into the processing chamber 100 results in the processing aperture 112 being positioned to process an actual location that is the same as the desired location that is intended by the user. Therefore, the position of the substrate center 502, the revolution center 504, and the position 506 of the aperture do not deviate from their ideal or desired positions.

The substrate 108 has completed a rotation of the substrate pedestal 106 and a revolution of the substrate pedestal 106. The processing aperture 112 begins at the home position (0, 0), as is indicated by the dashed circle showing the starting position 506-1 of the processing aperture 112, and after a rotation and revolution, the processing aperture 112 is located at the desired position at vector 902 $(r_1, \phi_1)$, as indicated by the solid circle showing the final position 506-2 of the processing aperture 112. The revolution center 504 is initially located at the position 504-1 of the revolution center, and after a rotation through the angle θ, the revolution center 504 moves to the position 504-2. The substrate pedestal 106 is then revolved through the angle ω about the revolution center 504 at the position 504-2 so that the processing aperture 112 moves to the position 506-2. The vector $(r_1, \phi_1)$ defines the position 506 of the processing aperture 112 above the substrate 108 after a rotation and a revolution.

Representative equations for $r_1$ and $\phi_1$ can be determined using trigonometry:

$$r_1 = 2r_r \sin\left(\frac{\omega}{2}\right)$$

$$\varphi_1 = \theta + \varphi_r + \left(\frac{\pi - \omega}{2}\right)$$

Figure 10:
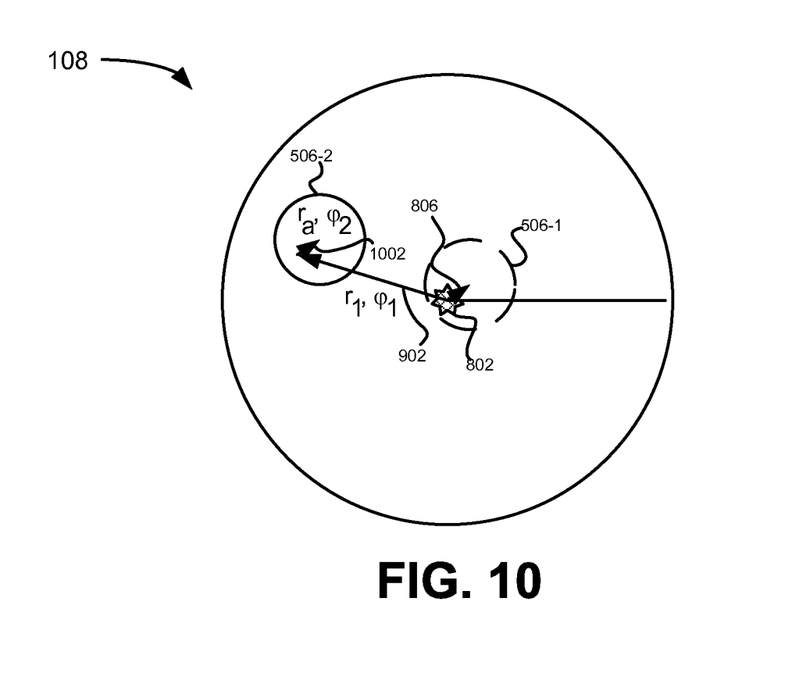
FIG. 10 illustrates a case where the processing aperture is offset from the desired position.

FIG. 10 illustrates a case where there is a processing aperture correction vector (i.e. the processing aperture 112 is offset from the desired position). The processing chamber 100 has been rotated and revolved so that the processing aperture 112 is at a position over the wafer at the vector 902 $(r_1, \phi_1)$. However, the processing aperture 112, at the home position, was offset from the center 502 of the substrate 108 by the vector 806 $(r_a, \phi_a)$ before the rotation and revolution. The vector 1002 is the vector 806 located at the end of the vector 902 and has the value $(r_a, \phi_2)$, where $\phi_2 = \phi_a + \theta - \omega$. The final position of the aperture (i.e. the "actual" position) is the vector sum of the vectors 902 $(r_1, \phi_1)$ and 1002 $(r_a, \phi_2)$, minus the vector 808 $(x_w, y_w)$, such that in Cartesian coordinates, the correction factor can be given by $F(\theta, \omega) = (x_f, y_f)$, where $x_f$ and $y_f$ are given by:

$$x_f = r_1 \cos\varphi_1 + r_a \cos\varphi_2 - x_w \text{ and} \quad \text{(Equation 1)}$$

$$y_f = r_1 \sin\varphi_1 + r_a \sin\varphi_2 - y_w \quad \text{(Equation 2)}$$

C. Measurement of Correction Vectors

For a specific configuration of a processing chamber 100, the correction vectors can be measured by processing predetermined regions of a substrate, measuring their actual locations, comparing the actual locations to the desired locations of the processed regions, and using the location on the test substrate to process any other substrates using the specific configuration. Changes in the processing chamber 100 may require recalculating the correction vectors and the correction factor. For example, if the process kit shield 110 or the substrate pedestal 106 are removed and reinstalled, the correction factor may change and may need to be recalculated.

Figure 11:
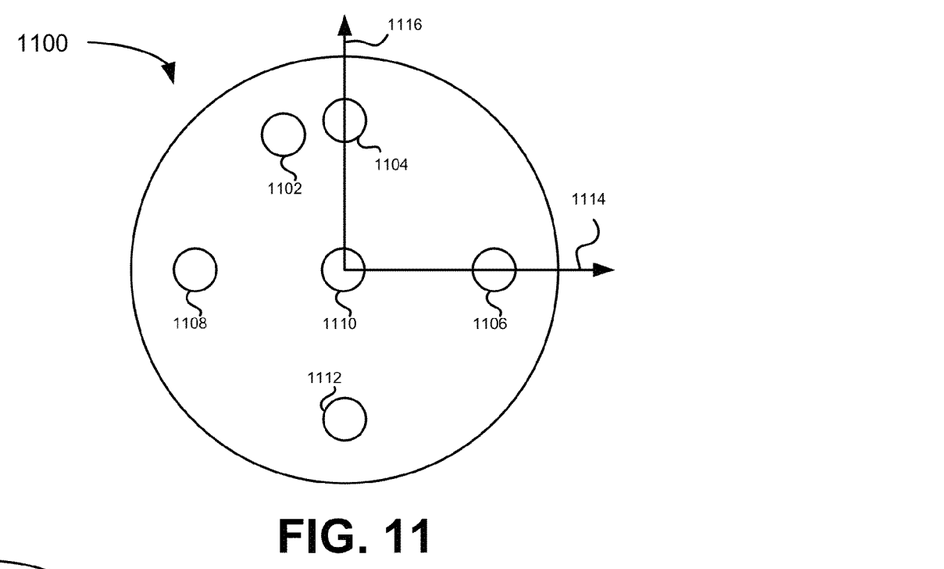
FIG. 11 illustrates a substrate that can be used to determine a correction factor for the processing chamber.

FIG. 11 illustrates a substrate 1100 processed to determine a correction factor for the processing chamber 100. Six regions 1102-1108 of the substrate 1100 are processed, each at locations on the substrate 1100 that can be used to calculate the correction vectors. Table 1 lists each of the regions, the region's desired location in units of rotation degrees (θ) and revolution degrees (ω). Table 1 also lists example actual x and y coordinates of the deposited regions for an example of the substrate 1100 (it is understood, however, that these coordinates are representative of one specific system configuration, which is an example of measurements taken in one processing system, and that different systems will likely have different actual measurements). The x and y coordinates are listed in the frame of reference where the center of the substrate 108 is (0, 0), and the axes are x-axis 1114 and y-axis 1116.

| Region | Rotation (θ) | Revolution (ω) | X Coords (mm) | Y Coords (mm) |
|---|---|---|---|---|
| 1102 | 20 | 90 | −55.86 | 85.83 |
| 1104 | 0 | 90 | −23.03 | 99.41 |
| 1106 | 0 | −90 | 99.33 | 21.83 |
| 1108 | 180 | −90 | −100.81 | −22.96 |
| 1110 | 0 | 0 | 5.39 | −3.13 |
| 1112 | 180 | 90 | 21.64 | −100.80 |

The regions 1102-1112 specified by the rotation and revolution coordinates as shown here can be used to determine the correction factor, however, it is understood that other groups of regions in different locations can also be used. These regions allow for the isolation of the correction vectors and errors:

The rotation center is halfway between regions 1102 and 1112, or halfway between regions 1106 and 1108. Though the individual regions 1102, 1112, 1106, and 1108 are affected by the offsets vectors 804 and 806, the center point between the regions is not.

The revolution center is halfway between regions 1104 and 1106, or position of the revolution center on the substrate when rotated by 180° is the halfway point between regions 1108 and 1112.

The aperture center correction vector can be determined from the center of the region 1110. It can be reconfirmed by using the rotation and revolution centers to calculate the desired position of the region 1104, and then calculating the vector between the desired position of region 1104 and the actual position of the region 1104.

The region 1102 is used to reconfirm sign conventions and identify the regions 1104-1112 in the case of gross (e.g. >45°) offsets.

In this example, more regions than are necessary are processed; the additional regions can be used to confirm the accuracy of the calculated values. For example, although the regions 1104 and 1106 can be used to calculate the correction vector for the revolution center, the regions 1106 and 1108 can be used to confirm the location of the revolution center.

Figure 12:
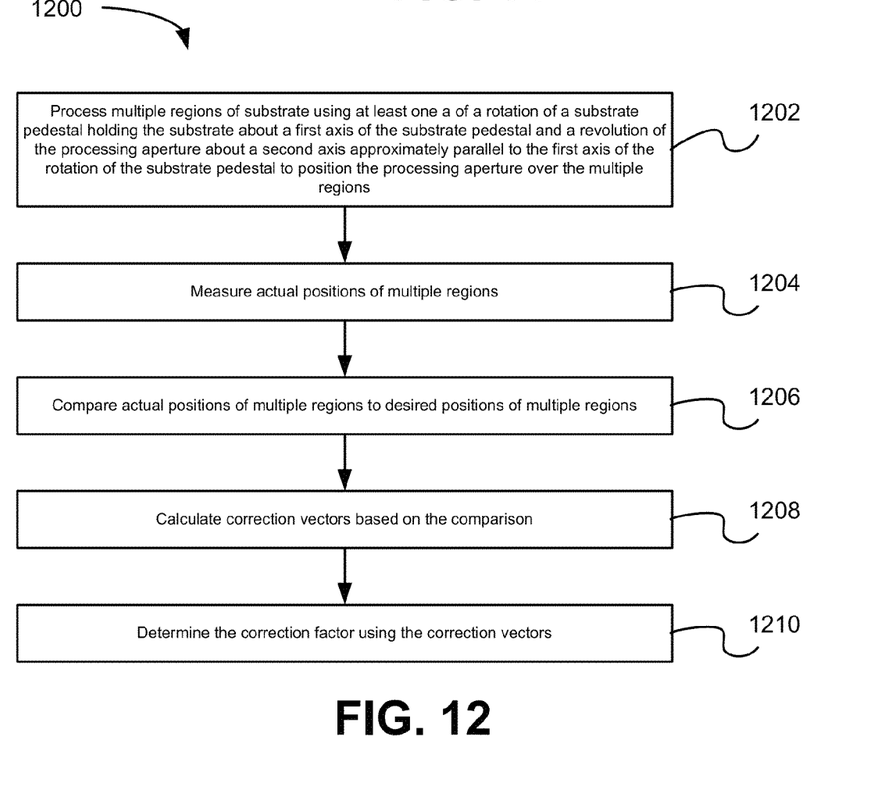
FIG. 12 is a flowchart describing a process for determining a correction factor for a semiconductor processing chamber.

FIG. 12 is a flowchart describing a process 1200 for determining a correction factor for a semiconductor processing chamber. In operation 1202, multiple regions of the substrate 1100 are processed. The multiple regions are processed using a processing aperture (e.g. the processing aperture 112) and at least one of a rotation of a substrate pedestal holding the substrate (e.g. the rotation through the angle θ of the substrate pedestal 106) about an axis of the substrate pedestal (e.g. the axis 113) and a revolution of the processing aperture about another axis (e.g. the axis 111). The processing aperture 112 is, in some embodiments, revolved relative to the substrate 108 when the substrate pedestal 106 is revolved through the angle ω. The axes are approximately parallel to each other (e.g. within 5° of each other), and the rotation and the revolution are to position the process aperture over the multiple regions of the substrate to be processed.

In operation 1204, the actual positions of the multiple regions are measured. In operation 1206, the actual positions are compared to the desired positions, and in operation 1208, correction vectors are calculated based on the comparison. The correction factor can then be determined using the correction vectors.

For example, in operation 1202, the regions 1102-1112 can be processed, and the actual positions of those regions are measured in operation 1204, for example by taking a photo of the substrate 1100 and determining the locations (i.e. the actual positions) of the regions 1102-1112. The rotation center can then be determined, for example, using the example in Table 1, the rotation center is located at (−0.72 mm, −0.63 mm) in Cartesian coordinates.

If the calculations are adjusted to make the rotation center (0, 0), then the revolution center 504 can then be given calculated as $(r_r, \phi_r)=(72.54 \text{ mm}, 57.6°)$, the position of the aperture 506 can be give as $(r_a, \phi_a)=(0.11 \text{ mm}, 223.8°)$, the position of the substrate center is given as $(x_w, y_w)=(0.72 \text{ mm}, 0.63 \text{ mm})$. Using these numbers and Equations 1 and 2, the correction factor can be applied for any given desired location so that the actual location of deposition will be approximately the desired location.

D. Calculation of Rotation and Revolution Angles for Desired Location

In order to have the actual location of deposition be approximately the same as the desired location of deposition, the angles θ for the rotation of the substrate pedestal 106 and ω for the revolution of the substrate pedestal 106 can be determined for a desired location on the substrate by solving for θ and ω in the equation $(\theta, \omega)=F^{-1}(x_f, y_f)$ (recalling above that $F(\theta, \omega)=(x_f, y_f)$). One way to approximate the values for θ and ω is using an iterative two-dimensional Newton's method:

$$f_1 = r_1 \cos\phi_1 + r_a \cos\phi_2 - x_W - x_f = 0 \quad \text{(Equation 3)}$$

$$f_2 = r_1 \sin\phi_1 + r_a \sin\phi_2 - y_W - y_f = 0 \quad \text{(Equation 4)}$$

$$J(\theta, \omega) = \begin{pmatrix} \frac{\partial f_1}{\partial \theta} & \frac{\partial f_1}{\partial \omega} \\ \frac{\partial f_2}{\partial \theta} & \frac{\partial f_2}{\partial \omega} \end{pmatrix} \quad \text{(Equation 5)}$$

Equations 3-5 can be calculated out in the following manner:

$$\frac{\partial f_1}{\partial \theta} = -r_1 \sin\varphi_1 - r_a \sin\varphi_2$$

$$\frac{\partial f_1}{\partial \omega} = \frac{r_1}{2}\sin\varphi_1 + r_r \cos\frac{\omega}{2}\cos\varphi_1 + r_a \sin\varphi_2$$

$$\frac{\partial f_2}{\partial \theta} = r_1 \cos\varphi_1 + r_a \cos\varphi_2$$

$$\frac{\partial f_2}{\partial \omega} = -\frac{r_1}{2}\cos\varphi_1 + r_r \cos\frac{\omega}{2}\sin\varphi_1 - r_a \cos\varphi_2$$

Beginning with an initial estimate of the uncorrected coordinates $(\theta_0, \omega_0)$, an iteration can be performed to give:

$$(\theta_{k+1}, \omega_{k+1}) = (\theta_k, \omega_k) - J^{-1}(\theta_k, \omega_k)F(\theta_k, \omega_k)$$

For example, using the correction vectors calculated above, $(\theta_0, \omega_0)$ where the (x, y) position on the substrate is (2 in, 2 in) is equal to $(\theta_0, \omega_0)=(4.418, 0.982)$.

III. Deposition Using Correction Factor

Figure 13:
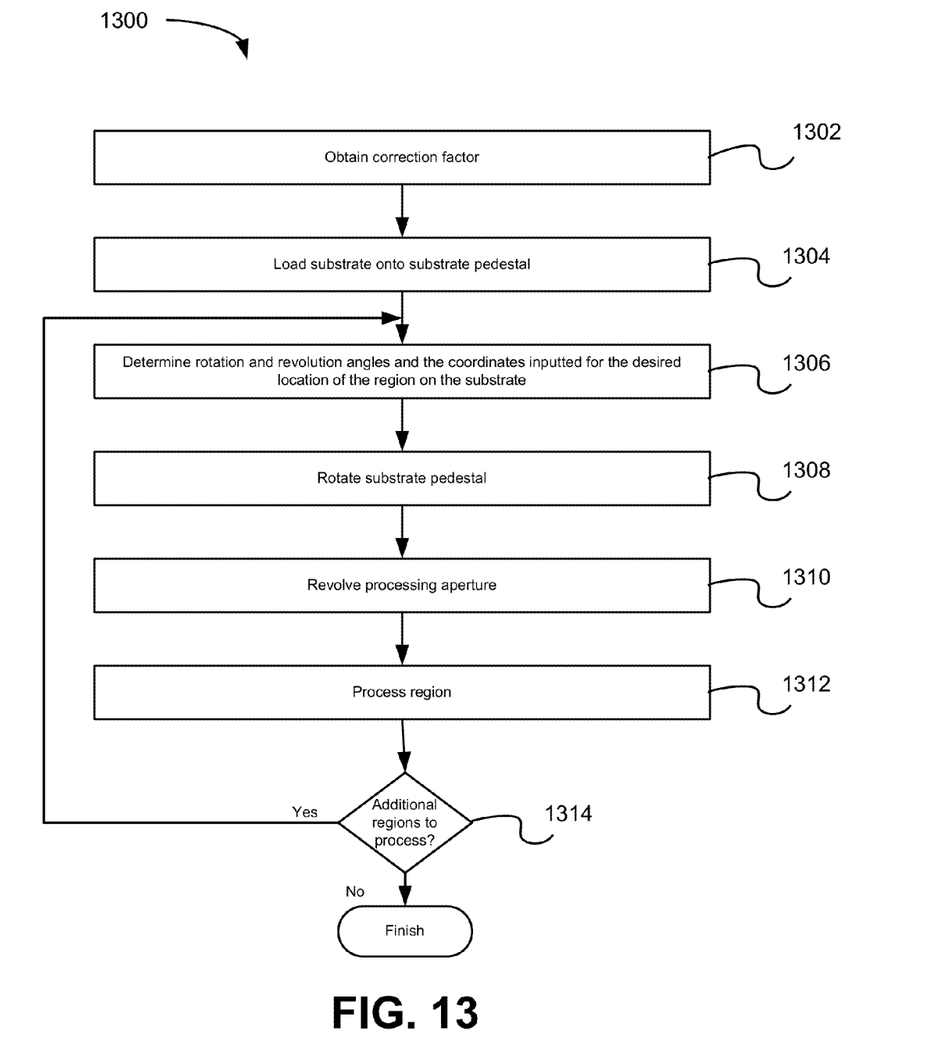
FIG. 13 is a flowchart describing a process for processing one or more regions of a substrate using a processing chamber and correction factor as described herein.

FIG. 13 is a flowchart describing a process 1300 for processing one or more regions of a substrate using a processing chamber and correction factor as described herein. The process 1300 begins in operation 1302, where a correction factor is obtained. The correction factor can be obtained using the process 1200, for example.

In operation 1304, a substrate is loaded onto the substrate pedestal 106. The substrate can be loaded using a robot 414, for example. In operation 1306, the controller 411 determines the rotation and revolution angles θ and ω using the correction factor and the coordinates inputted for the desired location on the substrate 108. The chamber 100 then rotates the substrate pedestal 106 about the axis 111 according to the request to deposit at a desired location in operation 1308. In operation 1310 the chamber 100 revolves the processing aperture 112 (e.g. by revolving the substrate pedestal 106) about the axis 113 according to the request. The rotating and revolving use the correction factor obtained in operation 1302.

In operation 1312, the region is processed, for example by depositing a material using PVD. In operation 1314, it is determined whether any additional regions are to be processed. Additional regions of the substrate can be processed using different processing characteristics (i.e. using different processing parameters such as different materials, different deposition times, different temperatures, different pressures, etc.) so that a combinatorial comparison can be made. For example, a first region can be processed by depositing a first material, and a second region can be processed using a different material. Additional variables that can be evaluated in a combinatorial fashion include power, gas mixtures, target compositions, etc. If additional regions are to be processed, the process 1300 returns to operation 1306. If no additional regions are to be processed, the process 1300 finishes.

IV. Other Alignment Techniques

Figure 14A:
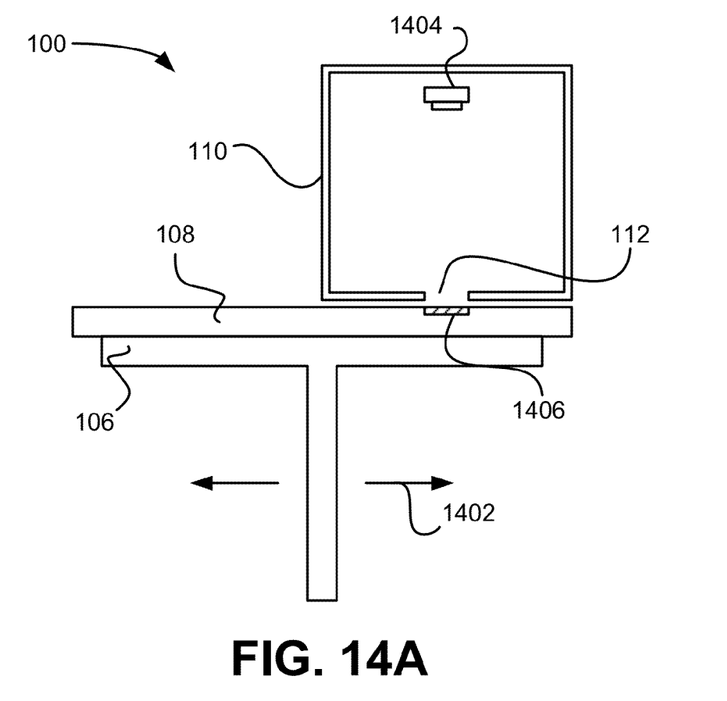
FIGS. 14A and 14B illustrate another technique for improving alignment of a substrate relative to a substrate pedestal.
Figure 14B:
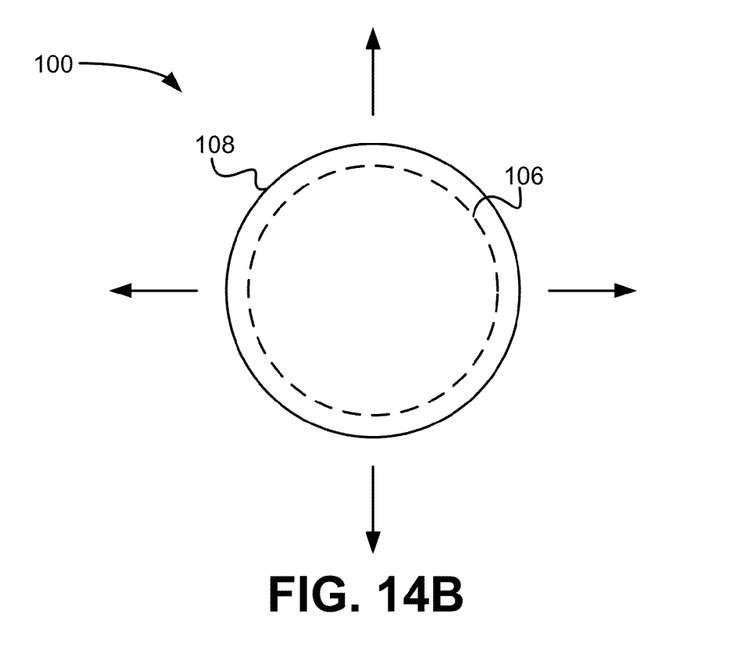

FIGS. 14A and 14B illustrate another technique for improving alignment of a substrate 108 relative to a substrate pedestal 106. FIG. 14A shows a cross-sectional view of the substrate pedestal 106 and the substrate 108, and FIG. 14B shows an overhead view of the substrate pedestal 106 and the substrate 108. The chamber 100 includes a movable substrate pedestal 106 that can move 1402 to change the relationship of the substrate 108 to the processing aperture 112. In other embodiments, the substrate 108 is movable with respect to the substrate pedestal 106; in other words, if the substrate 108 is misaligned upon the substrate pedestal 106, the substrate 108 can be move either manually or using a robot 414 or other mechanism.

An imaging device 1404 (e.g. a camera) is located in a position relative to the processing aperture 112 so that the imaging device 1404 can capture an image through the processing aperture 112. The imaging device 1404 can be, for example, directly above the processing aperture 112 so that a feature 1406 on the substrate 108 is visible through the processing aperture 112. The feature 1406 may be, for example, a processed region (e.g. a deposited region or an etched region), some other kind of marking, a wafer notch, etc. In one embodiment, the feature 1406 is sized so that the imaging device 1404 views the feature 1406 as approximately occupying the entirety of the processing aperture 112. For example, if the process kit shield 110 is very close to the substrate 108, the feature 1406 can have approximately the same shape and size as the processing aperture 112.

Once an image of the feature 1406 is created, the controller 411 can determine whether the alignment of the substrate is correct. If the alignment is correct, the substrate 108 can be processed by rotating and revolving the substrate pedestal 106 as described above to position the processing aperture 112 above a region of the substrate 108 for processing. If the alignment is not correct, the substrate 108 can then be moved; either relative to the processing aperture 112 or relative to both the processing aperture 112 and the substrate pedestal 106. The controller 411 can calculate the amount of movement necessary, and can use the imaging device 1404 to confirm that the alignment is correct after the movement.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. An apparatus comprising:
    a substrate pedestal configured to hold a substrate and rotate the substrate about a first axis;
    a plurality of deposition guns positioned above the substrate pedestal and configured to deposit at least one material on the substrate;
    a processing aperture between the substrate pedestal and the plurality of deposition guns and configured to revolve relative to the substrate pedestal around a second axis,
    wherein the second axis is offset from the first axis,
    wherein the processing aperture is further configured such that only one region of a plurality of regions of the substrate is exposed to the plurality of deposition guns; and
    a controller configured to:
        receive a location of the one region of the plurality of regions;
        control the rotation of the substrate pedestal and the revolution of the processing aperture such that the one region of the plurality of regions is exposed to the plurality of deposition guns; and
        apply a correction factor to a position of the aperture relative to the one region of the plurality of regions that accounts for offsets of the first axis, the second axis, and a center of the substrate
    wherein the offsets comprise:
        a first offset between the first axis and the center of the substrate;
        a second offset between an actual position of the aperture and a desired position of the aperture; and
        a third offset between an actual position of the second axis and a desired position of the second axis.

2. The apparatus of claim 1, wherein the plurality of deposition guns are configured to deposit the at least one material using physical vapor deposition (PVD), and the controller is configured to control the plurality of deposition guns.

3. The apparatus of claim 1, wherein the correction factor comprises:

$$x_f = r_1\cos\varphi_1 + r_a\cos\varphi_2 - x_w \text{ and}$$

$$y_f = r_1\sin\varphi_1 + r_a\varphi_2 - y_w;$$

wherein $(x_f, y_f)$ is the correction factor in Cartesian coordinates, $(r_1, \phi_1)$ is a position of the processing aperture above the substrate after at least one of a rotation about the first axis and a revolution around the second axis to position the aperture in polar coordinates, $(r_a, \phi_a)$ is a vector between the first axis and the processing aperture, $(x_w, y_w)$ is the first offset, $\phi_2 = \phi_a + \theta - \omega$, $\theta$ is an angle of rotation of the substrate pedestal, and $\omega$ is an angle of revolution of the processing aperture.

4. The apparatus of claim 1, wherein the apparatus is further configured to etch the substrate through the processing aperture.

5. The apparatus of claim 1, further comprising an imaging device to determine whether alignment of the substrate is correct.

6. The apparatus of claim 5, wherein the substrate pedestal is configured to move the substrate to correct the alignment.

7. The apparatus of claim 1, wherein the revolving the process aperture relative to the substrate pedestal comprises revolving the substrate pedestal.

8. The apparatus of claim 1, wherein the controller is further configured to control the plurality of deposition guns, the rotation of the substrate pedestal, and the revolution of the processing aperture to process a second region of the plurality of regions using different processing parameters than the one region of the plurality of regions.

9. The apparatus of claim 1, further comprises a cover plate configured to move into a position such that it covers the processing aperture.

10. The apparatus of claim 9, wherein the cover plate comprises at least one opening therethrough.

* * * * *